United States Patent
Benwadih

(10) Patent No.: US 9,112,160 B2
(45) Date of Patent: Aug. 18, 2015

(54) FIELD-EFFECT TRANSISTOR COMPRISING A LEAKAGE-CURRENT LIMITER

(71) Applicant: Commissariat A L'Energie Atomique Et Aux Energies Alternatives, Paris (FR)

(72) Inventor: Mohammed Benwadih, Champigny sur Marne (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 0 days.

(21) Appl. No.: 14/200,577

(22) Filed: Mar. 7, 2014

(65) Prior Publication Data

US 2014/0183513 A1    Jul. 3, 2014

Related U.S. Application Data

(63) Continuation of application No. PCT/FR2012/051798, filed on Jul. 30, 2012.

(30) Foreign Application Priority Data

Sep. 14, 2011   (FR) ..................... 11.58182

(51) Int. Cl.
*H01L 29/08* (2006.01)
*H01L 51/05* (2006.01)
*H01L 51/00* (2006.01)

(52) U.S. Cl.
CPC ........ *H01L 51/0529* (2013.01); *H01L 51/0001* (2013.01); *H01L 51/0541* (2013.01)

(58) Field of Classification Search
CPC ......................... H01L 51/0529; H01L 51/0001
USPC ............................ 257/40; 438/82, 99
See application file for complete search history.

(56) References Cited

U.S. PATENT DOCUMENTS

| 2003/0111670 A1* | 6/2003 | Misra et al. ............... 257/200 |
| 2005/0035333 A1* | 2/2005 | Gerlach .................... 252/500 |
| 2005/0056828 A1* | 3/2005 | Wada et al. ................ 257/40 |
| 2005/0059193 A1* | 3/2005 | Yoneya .................... 438/151 |
| 2006/0054883 A1 | 3/2006 | Hanna et al. |

(Continued)

FOREIGN PATENT DOCUMENTS

| EP | 2 020 693 A2 | 2/2009 |
| GB | 2458454 A * | 9/2009 |
| WO | 03/052841 A1 | 6/2003 |

OTHER PUBLICATIONS

International Search Report dated Nov. 29, 2012.

*Primary Examiner* — Jarrett Stark
*Assistant Examiner* — Mohammad M Hoque
(74) *Attorney, Agent, or Firm* — Burr & Brown, PLLC

(57) ABSTRACT

A field-effect transistor including at least one lower substrate having two electrodes deposited thereon, respectively a source electrode and a drain electrode, a dielectric layer made of a dielectric material, and a gate electrode deposited on the dielectric layer. It includes an intermediate layer, made of a material comprising molecules having a dipole moment complying with specific direction criteria, deposited between the gate electrode and the dielectric layer, said intermediate layer extending at least under the entire surface area taken up by the gate electrode, the intermediate layer being made of an organic compound comprising at least one binding function for the gate electrode.

5 Claims, 4 Drawing Sheets

(56) References Cited

U.S. PATENT DOCUMENTS

| | | |
|---|---|---|
| 2006/0255336 A1 | 11/2006 | Kim |
| 2007/0181961 A1 | 8/2007 | Marks et al. |
| 2008/0283751 A1 | 11/2008 | Kymissis |
| 2010/0084643 A1* | 4/2010 | Hirai ............... 257/40 |
| 2011/0318907 A1* | 12/2011 | Maeda et al. ............... 438/479 |
| 2012/0018706 A1* | 1/2012 | Kagan et al. ............... 257/40 |

* cited by examiner

FIELD-EFFECT TRANSISTOR COMPRISING A LEAKAGE-CURRENT LIMITER

FIELD OF THE INVENTION

The present invention relates to the field of organic transistors, such as, for example, organic thin-film transistors (OTFT). It more specifically relates to an organic transistor comprising means enabling to limit leakage currents appearing between the gate and the semiconductor of said transistor.

BACKGROUND

FIG. 1 shows an organic thin-film transistor of prior art, having a so-called "high-gate" and "low-contact" structure. In this instance, said transistor 1 comprises:
- a lower substrate 2, having two electrodes 3, 4, a first source electrode 3 and a second drain electrode 4, formed thereon,
- a semiconductor layer 5 made of a semiconductor material and deposited on lower substrate 2, source electrode 3 and drain electrodes 4,
- and a dielectric layer 6 made of a dielectric material and deposited on semiconductor layer 5, and having a gate electrode 7 formed thereon.

The transistor effect is obtained, as known per se, by applying a voltage between gate electrode 7 and lower substrate 2 to create, in semiconductor layer 5, a conduction channel 8 between source electrode 3 and drain electrode 4.

However, field-effect transistors integrating a semiconductor layer made of an organic material comprise a dielectric layer having imperfect insulating properties so that a leakage current 9, schematically shown in FIG. 1, appears between gate electrode 7 and electrodes 3 and 4, thus altering the operation of said transistor.

Indeed, leakage current 9, which is a current flowing through dielectric layer 6 from gate electrode 7 to source 3, strongly degrades current Ioff of the field-effect transistor.

When the leakage current is too strong, the transistor breaks down and current Ion and Ioff is no longer measured, the only measured current being the leakage current, since the field effect of the transistor has then disappeared.

Such a degradation of current Ioff of the field-effect transistor, due to the leakage current appearing between the gate electrode and the source electrode in the dielectric layer, forbids the use this type of organic field-effect transistor to form electric circuits.

To decrease the leakage current, it may be envisaged to modify the intrinsic properties of dielectric layer 6 and/or to increase the thickness of said dielectric layer 6. "Intrinsic properties of dielectric layer 6" means the insulating properties of said dielectric layer and/or the quality of the deposited dielectric layer.

However, modifying the intrinsic properties of dielectric layer 6 or increasing its thickness increases the manufacturing costs of such transistors and also modifies the other transistor characteristics, such as, particularly, the capacitance of the dielectric layer, which is then capable of generating stray capacitances also altering the proper operation of the transistor.

SUMMARY OF THE INVENTION

One of the aims of the invention thus is to overcome such disadvantages by providing a field-effect transistor of simple design, low cost, and limiting the leakage current between the gate electrode and the source or drain electrode without modifying the intrinsic characteristics of the dielectric layer.

For this purpose, the invention provides a field-effect transistor comprising at least one lower substrate having two electrodes deposited thereon, a source electrode and a drain electrode, a so-called dielectric layer made of a dielectric material, and a gate electrode deposited on the dielectric layer. According to the invention, this transistor further comprises an intermediate layer, called blocking layer, made of a material comprising molecules having a dipole moment complying with specific direction criteria, deposited between the gate electrode and the dielectric layer, said intermediate layer extending at least under the entire surface area taken up by the gate electrode.

The intermediate layer creates an energy barrier under the gate electrode, which limits the passing of charges. Thus, and for example, the negative charge at the surface of the molecules of the intermediate blocking layer repels the electrons which are attempting to pass from the gate electrode to the dielectric layer when the transistor is of type N.

The material forming the intermediate layer used is comprised of at least one organic compound comprising at least one binding function for the gate electrode.

Advantageously, said organic compound comprises a spacer R, formed of a linear, branched, or cyclic carbon chain and also capable of comprising at least one heteroatom.

According to an embodiment of the invention, the gate electrode is metallic and said material forming the intermediate layer is made of an organosulfur compound, organosulfur compounds providing a binding to gold molecules, more generally forming the source and drain electrodes.

Further, at least part of the molecules of the material forming the intermediate layer have a dipole moment directed towards the gate electrode when the transistor is of type N. Such molecules enable to block the electrons present on the gate electrode.

According to a variation of the invention, at least part of the molecules of the material forming the intermediate layer have a dipole moment directed towards the dielectric layer when the transistor is of type P, which enables to block holes, thus limiting their passing from the gate electrode to the dielectric layer.

Another object of the invention relates to a method of manufacturing a field-effect transistor comprising at least one step of depositing two electrodes on a substrate, a source electrode and a drain electrode, a step of depositing a dielectric layer, and a step of depositing a gate electrode on said dielectric layer. This method comprises, prior to the deposition of the gate electrode, depositing on the dielectric layer an intermediate layer made of a material comprising molecules having a dipole moment, the gate electrode being deposited on said intermediate layer.

Preferably, the intermediate layer is deposited on the dielectric layer by inkjet.

BRIEF DESCRIPTION OF THE DRAWINGS

The foregoing and other features and advantages will better appear from the following description of several alternative embodiments, given as non-limiting examples in connection with the accompanying drawings, among which.

DETAILED DESCRIPTION OF THE INVENTION

Figure 1:
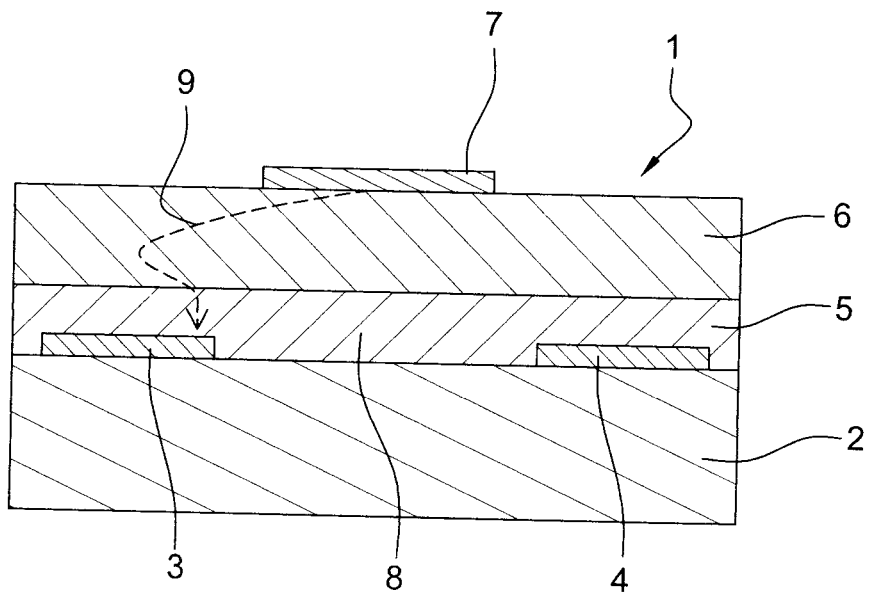
FIG. 1 is a simplified cross-section view of a so-called "high gate" and "low contact" field-effect transistor of prior art.

For clarity, in the following description, the same elements have been designated with the same reference numerals in the different drawings. Further, the various cross-section views are not necessarily drawn to scale.

Figure 2:
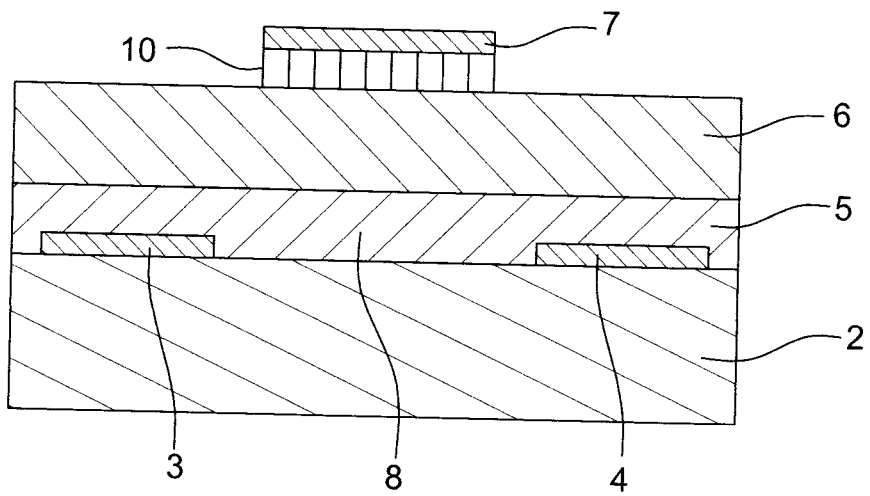
FIG. 2 is a simplified cross-section view of a "high gate" and "low contact" field-effect transistor comprising means for limiting the leakage current according to the invention.

Referring to FIG. 2, field-effect transistor 1 according to the invention has a "high gate" and "low contact" structure. It comprises a lower substrate 2 having two electrodes 3, 4 deposited thereon, source electrode 3 and drain electrode 4. It further comprises a semi-conductor layer 5 made of a semi-conductor material and deposited on lower substrate 2, source electrode 3, and drain electrode 4. It then comprises a dielectric layer 6 made of a dielectric material and deposited on semiconductor layer 5. Finally, a gate electrode 7 is formed on dielectric layer 6.

According to an essential feature of the invention, transistor 1 also comprises an intermediate layer 10 also called blocking layer, made of a material comprising molecules having a dipole moment, and deposited between gate electrode 7 and dielectric layer 6, said intermediate layer 10 extending under the entire surface of gate electrode 7.

Of course, intermediate layer 10 may extend over the entire surface of dielectric layer 6 without for all this departing from the framework of the invention.

Lower substrate 2 is made of a material selected from the group comprising: glass, doped or undoped silicon, polymers such as polyethylene terephthalate (PET), polyethylene naphthalate (PEN), polyimide (PI), polycarbonate, polystyrene, acrylates, etc.

Lower substrate 2 may however be made of any other material well known by those skilled in the art.

Semiconductor layer 5 is made of an organic semiconductor material selected from the group comprising: organic semiconductor molecules such as tetracene, pentacene, phthalocyanine, semiconductor polymers such as polythiophene, polyfluorene, polyphenylene vinylene or derivatives thereof such as poly(3-octyl), thiophene, poly[2-methoxy-5-(2'-ethyl-hexyloxy)-1,4-], phenylene, vinylene, or oligomers such as α-sexithiophenes.

Although the present invention is particularly adapted to organic transistors, that is, to transistors where semiconductor layer 5 is made of an organic material, the invention may also apply to so-called inorganic transistors. Thus, semiconductor layer 5 may also be made of an inorganic semiconductor material well known by those skilled in the art, such as silicon or gallium arsenide (GaAs), for example.

Further, dielectric layer 6 is made of a material selected from the group comprising: silicon dioxide, silicon nitrate, titanium dioxide, aluminum oxides, hafnium dioxide, polyimides, polyvinyl, pyrrolidone, polymethylmethacrylate, polyamide, parylene, polystyrene, polyvinylphenol, a fluoropolymer, or of any other dielectric material well known by those skilled in the art.

Further, source, drain, and gate electrodes 3, 4, and 7 are advantageously made of a metal such as aluminum, titanium, nickel, gold, chromium, etc. They may also contain metal particles, metal oxides such as indium-tin oxide, indium-zinc oxide, etc . . . , conductive polymers such as 3, 4-polyethylene dioxythiophene-polystyrene sulfonate (PEDOT: PSS), or polyaniline, etc . . . , or doped silicon materials.

The intermediate layer characteristic of the invention is advantageously made of a material formed of molecules having a dipole moment, that is, having their negative and positive charges concentrated in opposite locations, thus defining a dipole moment. Thus, a molecule is polar if it contains at least one polarized covalent bond and if the barycentre of the partial positive charges does not coincide with the barycentre of the partial negative charges.

Figure 3:
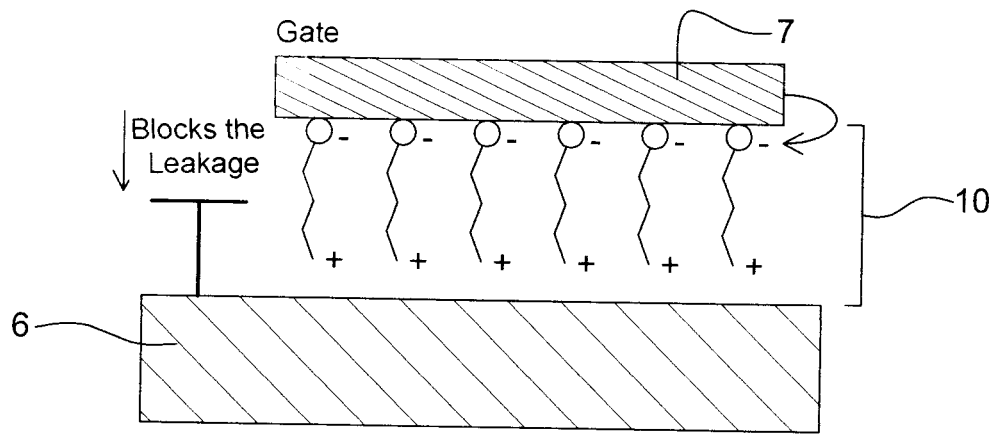
FIG. 3 is a simplified cross-section view of the interface between the gate electrode and the dielectric layer of the field-effect transistor according to the invention.
Figure 4:
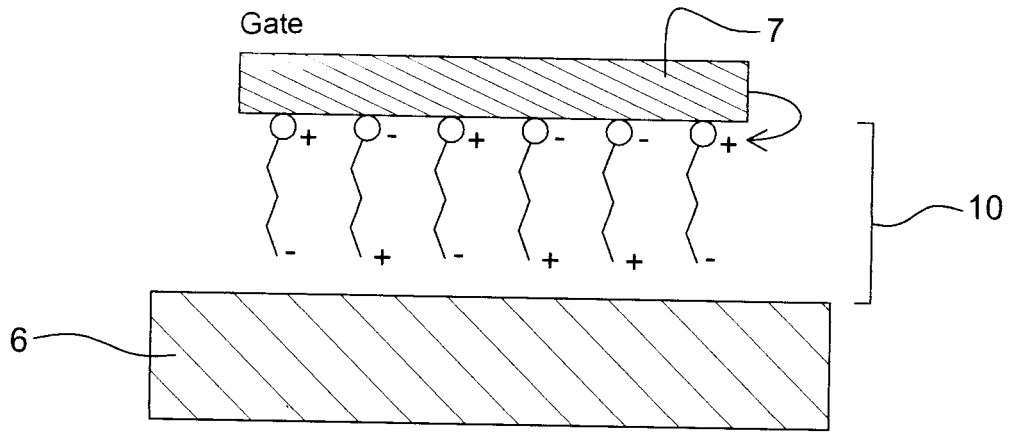
FIG. 4 is a simplified cross-section view of the interface between the gate electrode and the dielectric layer of an alternative embodiment of the field-effect transistor of the invention.

Referring to FIGS. 3 and 4, and considering an N-type transistor, intermediate layer 10 located under gate electrode 7 is made of a material formed of molecules having their dipole moment directed towards the gate. In other words, the dipole moment of the molecules forming said material is directed substantially perpendicularly to the plane of the layers. Thereby, intermediate layer 10 creates an energy barrier under gate electrode 7, which blocks the passing of electrons. The negative charge at the surface of the molecules of intermediate layer 10 repels the electrons attempting to pass from gate electrode 7 towards dielectric layer 6. In this embodiment, the N barycentre of the material forming intermediate layer 10 is positioned at the level of the lower surface of gate electrode 7, thus blocking the electrons at said gate electrode.

According to an alternative embodiment, not shown in the drawings, the P barycentre of the material forming intermediate layer 10 may be located at the level of the lower surface of gate electrode 7. Thereby, said material blocks the holes of dielectric layer 6, preventing the passing of electrons from gate electrode 7 into dielectric layer 6, and thus the creation of a leakage current in said dielectric layer 6, even if the electrons pass into intermediate layer 10.

As a variation, referring to FIG. 4, intermediate layer 10 located under gate electrode 7 is made of a so-called SAM or self-assembled monolayer comprising an electrical imbalance within the molecules forming said monolayer. Such an electrical imbalance of the molecules of the self-assembled monolayer thus enables to block part of the electrons at gate electrode 7 and to block the holes of dielectric layer 6, thus avoiding any creation of a leakage current in the dielectric layer even if part of the electrons pass into intermediate layer 10.

Figure 5:
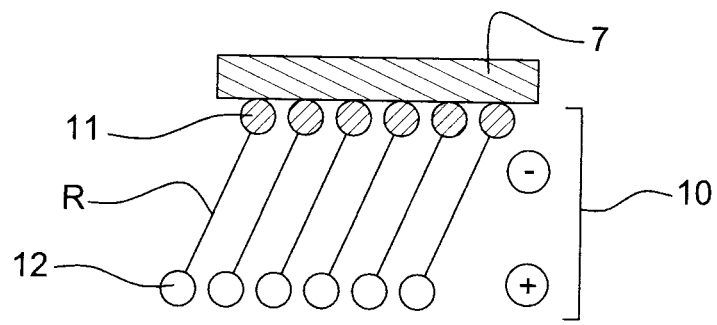
FIG. 5 is a simplified cross-section view of the gate electrode and of a layer made of a material comprising molecules having a dipole moment of the field-effect transistor according to the invention.

Preferably, referring to FIG. 5, the material forming the intermediate layer is comprised of at least one organic compound having at least one binding function 11 for gate electrode 7 and one spacer R. Said spacer R may be a linear, branched, or cyclic carbon chain, and may also comprise at least one heteroatom.

It should be observed that binding function 11 is not necessarily a molecule generating a chemical bond with the molecules of gate electrode 7. Indeed, the binding function for gate electrode 7 may be provided by Van der Waals forces, for example.

Figure 6:
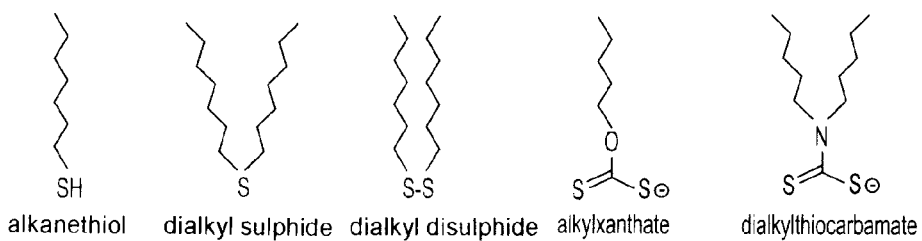
FIG. 6 is a simplified representation of the different molecules of the material forming the intermediate layer of the field-effect transistor according to the invention.
Figure 6:
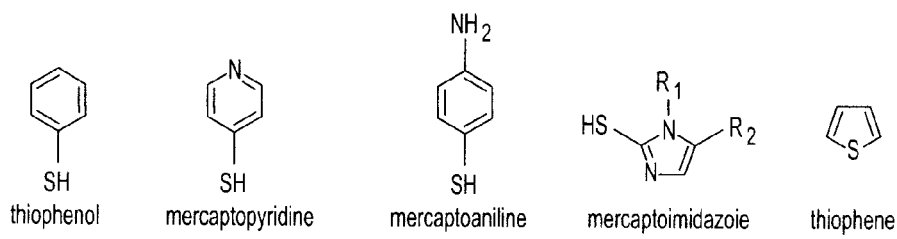
Figure 6:
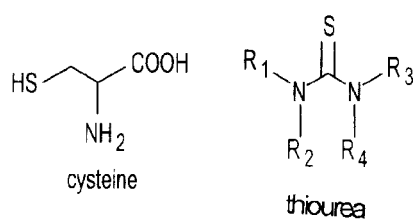
Figure 6:
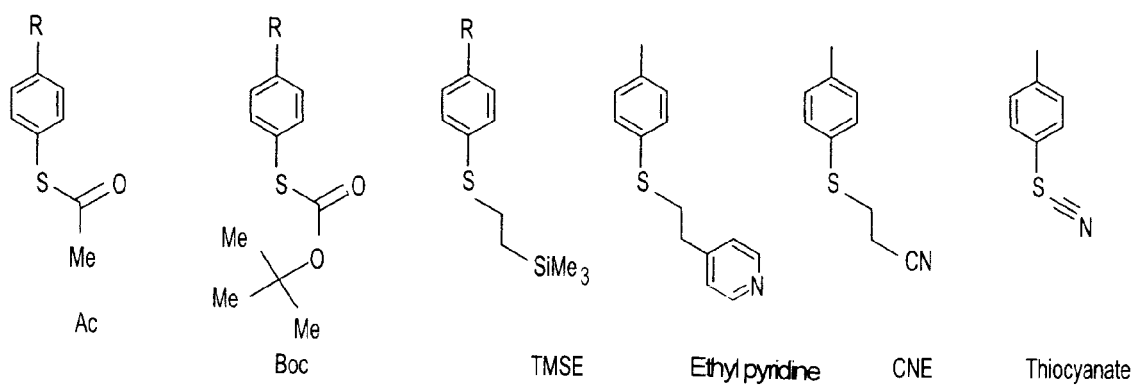
Figure 6:
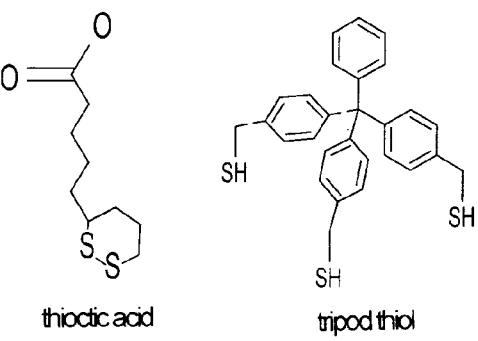

Referring to FIG. 6, the material forming the intermediate layer may for example be aan organosulfur compound, that is, an organic molecule comprising a thiol (SH) group. Organosulfur materials provide a binding in the form of a chemical bond with gold molecules, when the source and drain electrodes are made of this metal. The organosulfur material may for example be made of alkanethiol, triophenol, mercaptopyridine, mercaptoaniline, mercaptoimidazole, cysteine, or tripod thiol.

However, said material may be made of other organosulfur materials, such as, for example, compounds comprising a dialkyl sulphide, dialkyl disulphide, alkyl xanthate, dialkylthiocarbonate, thiophene, thiourea, thioctic acid, thiocyanate, ethyl pyridine, ethyl nitrile (CNE), trimethylsilyl ethyl (TMSE), acetyl, or tert-butoxycarbonyl group.

It should be noted that organosulfur compounds comprising an acetyl (Ac), tertbutoxycarbonyl (Boc), trimethylsilyl ethyl (TMSE), ethyl pyridine, ethyl nitrile (CNE), thiocyanate, thioctic acid, and tripod-thiol group are particularly suitable for the forming of a self-assembled monolayer (SAM) on gold.

Figure 7:
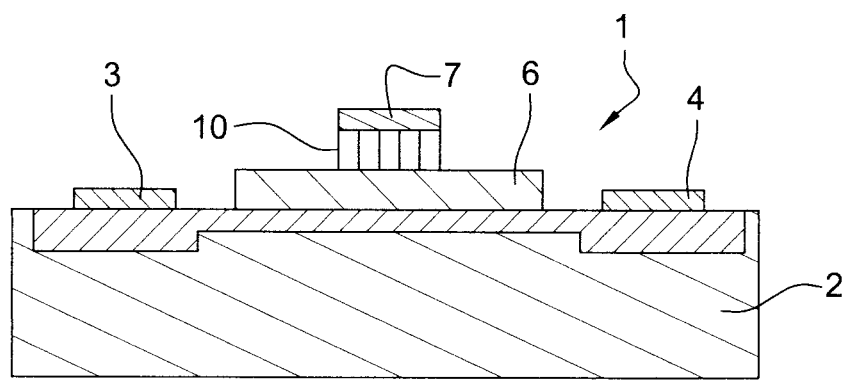
FIG. 7 is a simplified view of an alternative embodiment of the "low gate" field-effect transistor according to the invention.

Example of Embodiment:

Referring to FIG. 7, field-effect transistor 1 is obtained by deposition on a substrate of polyethylene naphthalate (PEN) having an approximate thickness of 125 micrometers, forming lower substrate 2 of the transistor, and of 3 nanometers of gold (Au).

The gold layer (Au) is then etched to obtain a source electrode 3 and a drain electrode 4.

A semiconductor layer 5 made of triisopropylsilyl pentacene (TIPS) having an approximate thickness of 90 nanometers is then deposited by photogravure, and covered with a dielectric fluoropolymer layer 6, sold under trade name CYTOP® for example, having an approximate thickness of 800 nanometers.

Then, cysteine molecules of general formula HSNH2COOH are deposited by inkjet on a portion of the upper surface of dielectric layer 6 at the level of gate electrode 7 to form an intermediate layer 10.

Finally, 50 nanometers of gold are deposited on said intermediate layer 10 to form gate electrode 7.

Intermediate layer 10 may be deposited by any other deposition method well known by those skilled in the art, such as thermal evaporation, or by a photolithographic method, for example, without for all this departing from the framework of the invention.

The invention claimed is:

1. A field-effect transistor comprising at least one lower substrate having two electrodes deposited thereon, respectively a source electrode and a drain electrode, a dielectric layer made of a dielectric material, and a gate electrode deposited on the dielectric layer,
    wherein the field-effect transistor comprises an intermediate layer, made of a material comprising molecules having a dipole moment complying with specific direction criteria, deposited between the gate electrode and the dielectric layer, said intermediate layer extending at least under the entire surface area taken up by the gate electrode,
    wherein the intermediate layer is made of an organic compound comprising at least one binding function for the gate electrode,
    wherein the organic compound forming the intermediate layer further comprises a spacer formed of a linear, branched, or cyclic carbon chain and also capable of comprising at least one heteroatom; and
    wherein at least part of the molecules of the material forming the intermediate layer have a dipole moment directed towards the gate electrode when the transistor is of type N or at least part of the molecules of the material forming the intermediate layer have a dipole moment directed towards the dielectric layer when the transistor is of type P.

2. The field-effect transistor of claim 1, wherein the gate electrode is metallic and wherein the organic compound comprises at least one organosulfur compound.

3. A method of manufacturing a field-effect transistor comprising:
    at least depositing two electrodes, respectively a source electrode and a drain electrode, on a substrate,
    depositing a dielectric layer, and
    depositing a gate electrode on the dielectric layer,
    wherein, prior to the deposition of the gate electrode, it comprises depositing on the dielectric layer an intermediate layer made of a material comprising molecules having a dipole moment and formed of an organic compound comprising at least one binding function for the gate electrode, said gate electrode being deposited on said intermediate layer so that the entire lower surface of the gate electrode is in contact with the intermediate layer,
    wherein material forming the intermediate layer is made of an organic compound comprising a spacer formed of a linear, branched, or cyclic carbon chaing and also capapble of comprising a heteroataom, and
    wherein at least part of the molecules of the material forming the intermediate layer have a dipole moment disposed towards the gate electrode when the transistor is of type N or at least part of the molecules of the material forming the intermediate layer have a dipole moment directed towards the dielectric layer when the transistor is of type P.

4. The method of manufacturing a field-effect transistor of claim 3, wherein the intermediate layer is deposited on the dielectric layer by inkjet.

5. The method of manufacturing a field-effect transistor of claim 3, wherein the material forming the intermediate layer is made of at least one organosulfur compound and in that the gate electrode is metallic.

* * * * *